United States Patent
Fukiage

(10) Patent No.: US 7,201,174 B2
(45) Date of Patent: Apr. 10, 2007

(54) PROCESSING APPARATUS AND CLEANING METHOD

(75) Inventor: Noriaki Fukiage, Tsukui-gun (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 10/344,043

(22) PCT Filed: Aug. 7, 2001

(86) PCT No.: PCT/JP01/06785

§ 371 (c)(1),
(2), (4) Date: Feb. 7, 2003

(87) PCT Pub. No.: WO02/12585

PCT Pub. Date: Feb. 14, 2002

(65) Prior Publication Data

US 2004/0011379 A1    Jan. 22, 2004

(30) Foreign Application Priority Data

Aug. 8, 2000 (JP) .............................. 2000-240292

(51) Int. Cl.
*B08B 6/00* (2006.01)
*B08B 9/00* (2006.01)
*H01L 21/306* (2006.01)

(52) U.S. Cl. ................. 134/1.1; 134/22.1; 156/345.24; 156/345.25; 438/905

(58) Field of Classification Search ................. 134/1.1, 134/22.1; 156/345.24, 345.25, 345; 250/574; 438/905
See application file for complete search history.

(56) References Cited

U.S. PATENT DOCUMENTS

| | | | |
|---|---|---|---|
| 5,759,424 A * | 6/1998 | Imatake et al. ................. 216/60 |
| 5,812,403 A * | 9/1998 | Fong et al. .................. 700/121 |
| 5,902,403 A | 5/1999 | Aitani et al. |
| 5,985,032 A | 11/1999 | Eriguchi |
| 6,077,387 A * | 6/2000 | Tesauro .................. 156/345.24 |
| 6,079,426 A | 6/2000 | Subrahmanyam et al. |
| 6,170,492 B1 * | 1/2001 | Ueda et al. ................... 134/1.1 |
| 6,192,898 B1 * | 2/2001 | Aitani et al. .................. 314/1.1 |
| 6,306,246 B1 * | 10/2001 | Melvin et al. ......... 156/345.25 |
| 6,366,346 B1 * | 4/2002 | Nowak et al. ................. 356/72 |
| 6,737,666 B1 * | 5/2004 | Ito et al. ...................... 250/574 |

FOREIGN PATENT DOCUMENTS

| | | |
|---|---|---|
| EP | 0 843 348 A | 5/1998 |
| EP | 0 741 406 A | 11/1998 |
| JP | 01-066937 A | 6/1989 |
| WO | WO 00 31773 A | 6/2000 |
| WO | WO 01 77406 A | 10/2001 |
| WO | WO-0031773 | * 6/2002 |

* cited by examiner

Primary Examiner—Michael Barr
Assistant Examiner—Saeed Chaudhry
(74) Attorney, Agent, or Firm—Crowell & Moring LLP

(57) ABSTRACT

In a chamber (11), a SiOF film is formed on a wafer W using a plasma CVD method. A film remaining inside the chamber (11) is cleaned up using a gas containing $NF_3$. A manometer (28) is prepared for the chamber (11). An end point of cleaning of the chamber (11) is detected by monitoring the pressure inside the chamber (11).

18 Claims, 12 Drawing Sheets

PROCESSING APPARATUS AND CLEANING METHOD

TECHNICAL FIELD

The present invention relates to a processing apparatus and a cleaning method in which an efficient cleaning is possible.

BACKGROUND ART

Various CVD (Chemical Vapor Deposition) apparatuses are used for manufacturing electronic devices, such as semiconductor devices, LCD (Liquid Crystal Display) devices, etc. Plasma CVD apparatuses are widely used for forming high quality films.

The plasma CVD apparatus forms a film on a semiconductor wafer contained inside a decompressed chamber, using a CVD method. The CVD method employs a gas phase reaction. Thus, films are formed only on the surface of the wafers, but on the surface (internal wall, etc.) of a chamber member. Thus formed films cause particles to be generated, thereby lowering the yield of the products. In such circumstances, it is necessary to regularly clean the inside of the chamber, to remove the films formed on the chamber member.

A well-known method for cleaning the inside of the chamber is an in-situ plasma cleaning method, wherein a cleaning gas is introduced into the chamber, and plasma is generated from a gas inside the chamber. However, plasma is generated inside the chamber, so that the chamber member is likely to be deteriorated.

A remote plasma cleaning method has been proposed. In this remote plasma cleaning method, plasma of a cleaning gas is generated outside the chamber, and the generated plasma is introduced into the chamber so as to clean the inside of the chamber. Using this remote plasma cleaning method, the chamber member is unlikely to be deteriorated. Such a remote plasma cleaning method is disclosed in Unexamined Japanese Patent Application KOKAI Publication No. H9-69504 (U.S. Priority No. 08/278605).

In the cleaning of the chamber using plasma, it is important to obtain an accurate end point of the cleaning, since the reactivity of plasma is high. Insufficient cleaning of the chamber causes particles to be generated, while excessive cleaning causes the chamber member to be deteriorated.

Conventionally, in the remote plasma cleaning method, the end point of cleaning had been estimated, based on the cleaning rate obtained in advance by carrying out some experiment. However, in this cleaning method, the actual cleanness inside the chamber is not measured. Hence, the end point of cleaning used above does not have high accuracy. The plasma cleaning using inaccurate end point causes the insufficient or excessive cleaning of the chamber, and thereby lowering the productivity of the CVD apparatus. Accordingly, in the conventional remote plasma cleaning, it is difficult to obtain the accurate end point of cleaning, so that it is difficult to obtain sufficiently high productivity of the CVD apparatus.

DISCLOSURE OF INVENTION

The present invention has been made in consideration of the above. It is accordingly an object of the present invention to provide a processing apparatus and a cleaning method in which an efficient cleaning is possible.

Another object thereof is to provide a processing apparatus and a cleaning method in which an accurate end point of cleaning can be detected.

In order to achieve the above objects, according to the first aspect of the present invention, there is provided a processing apparatus (10) comprising: a chamber (11); a gas source (SA) for supplying a gas for cleaning inside of said chamber (11); a gas line (L1) for introducing the gas supplied from said gas source (SA) into said chamber (11); an activator (12) which is prepared in said gas line (L1) and activates the gas supplied from said gas source (SA); a pressure measurement device (28) which measures a pressure in said chamber (11); and a controller (100) which detects an end point of cleaning, based on data representing the pressure measured by said pressure measurement device (28).

In order to achieve the above objects, according to the second aspect of the present invention, there is provided a method for cleaning inside of a chamber (11), for performing predetermined processing for a target object thereinside, by supplying a gas activated outside said chamber (11) into said chamber (11), said method comprising the steps of: measuring a pressure inside said chamber (11), while cleaning said chamber (11); and detecting an end point of cleaning of said chamber (11), based on pressure data obtained by said step of measuring.

BRIEF DESCRIPTION OF DRAWINGS

These objects and other objects and advantages of the present invention will become more apparent upon reading of the following detailed description and the accompanying drawings in which.

BEST MODE FOR CARRYING OUT THE INVENTION

Processing apparatus according to preferred embodiments of the present invention will now be described with reference to the accompany drawings.

Each of the processing apparatus according to the preferred embodiments includes a chamber. In this chamber, a SiOF film is formed on a semiconductor wafer (hereinafter referred to as a wafer W) using a plasma CVD technique, employing a process gas which is composed of $SiH_4$, $SiF_4$ and $O_2$. The SiOF film, remaining inside the chamber after the formation of the film, is removed using a cleaning gas including $NF_3$.

First Embodiment

Figure 1:
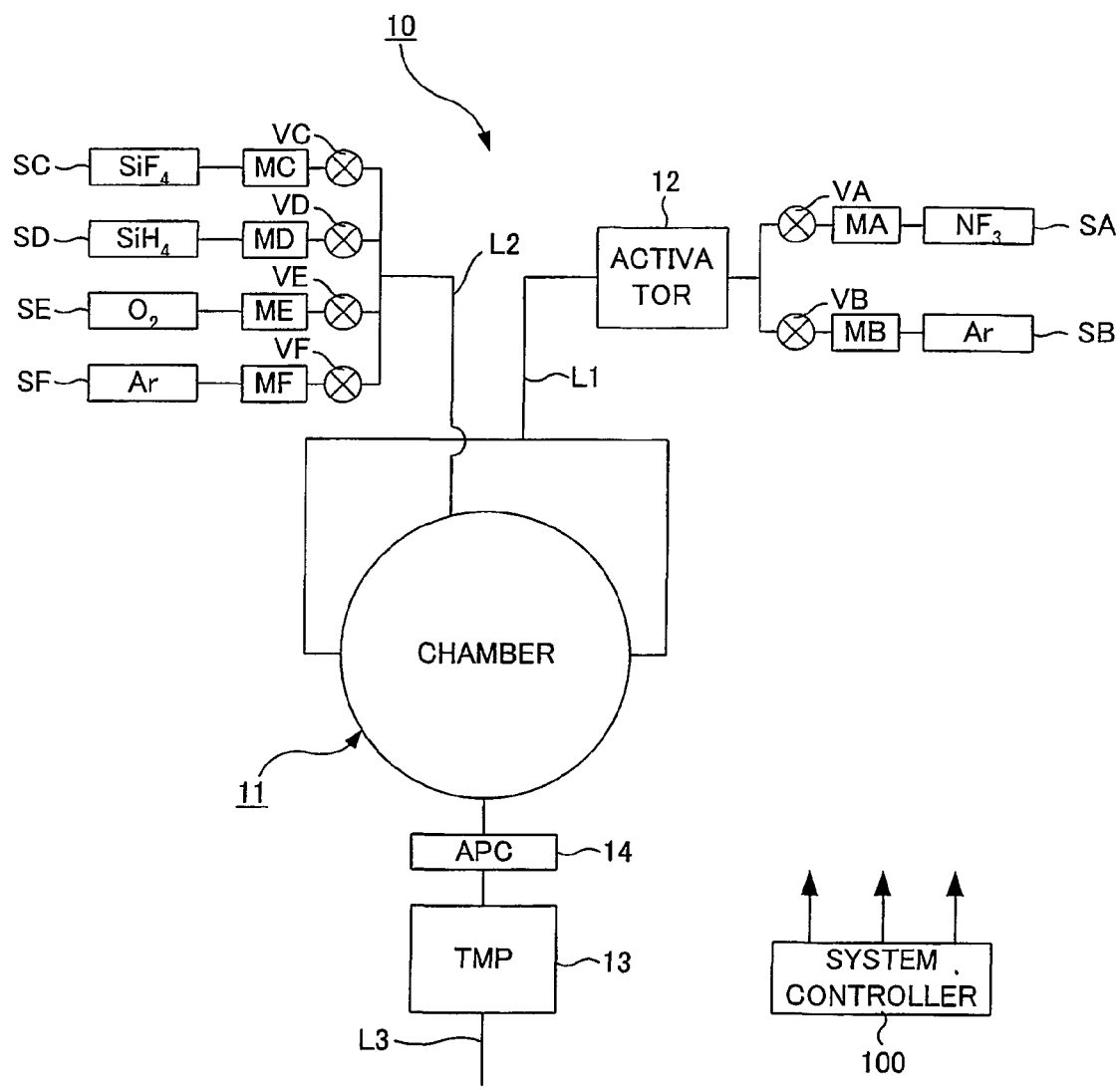
FIG. 1 is a diagram showing the structure of a processing apparatus according to the first embodiment of the present invention.

FIG. 1 shows an example of the structure of a processing apparatus according to the first embodiment of the present invention. As shown in FIG. 1, the processing apparatus 10 comprises a chamber 11, a cleaning gas line L1, a process gas line L2, an exhaust line L3, and a system controller 100.

The chamber 11 is a process chamber in which the atmosphere can be decompressed into a vacuum state. As will be explained later, plasma CVD processing is performed inside the chamber 11.

The cleaning gas line L1 connects the chamber 11 to an $NF_3$ source SA, serving as a cleaning gas source, and also to an Ar source SB, serving as a carrier gas source. The $NF_3$ source SA and Ar source SB are connected to the cleaning gas line L1, respectively through mass-flow controllers MA and MB, and also through valves VA and VB. Those lines, for connecting the $NF_3$ source SA and Ar source SB, and chamber 11 are, connected on vent parts of the valves VA and VB so as to be formed into a single line. In this structure, $NF_3$ and Ar are mixed at a predetermined ratio by the controllers MA and MB and valves VA and VB, and supplied to the chamber 11.

The converged cleaning gas line L1 is connected to an activator 12. The activator 12 activates the cleaning gas flowing therethrough so as to generate plasma of the gas. Fluorine radical (F) which is included in the plasma of the cleaning gas including $NF_3$ is selectively discharged from the activator 12. Hence, the cleaning gas mainly including fluorine radical is introduced into the chamber connected to the vent part of the activator 12. The cleaning gas line L1 is diverged into two lines from the vent part of the activator 12, so as to introduce the cleaning gas into the chamber 11 through the two lines.

The process gas line L2 connects chamber 11 to an $SiF_4$ source SC, an $SiH_4$ source SD, an $O_2$ source SE, and to an Ar source SF. The $SiF_4$ source SC, $SiH_4$ source SD, $O_2$ source SE, and Ar source SF are connected to the process gas line L2 respectively through mass-flow controllers MC, MD, ME, and MF, and also through valves VC, VD, VE, and VF. Those lines for connecting the $SiF_4$ source SC, $SiH_4$ source SD, $O_2$ source SE and Ar source SF, and chamber 11 are converged on the vent parts of the valves VC, VD, VE, and VF, so as to be formed into a single line. In this structure, $SiF_4$, $SiH_4$, $O_2$ and Ar are mixed at a predetermined ratio by the mass-flow controllers MC, MD, ME, and MF and also the valves VD, VD, VE, and VF, and supplied to the chamber 11.

A TMP (Turbo Molecular Pump) 13 is connected to the exhaust line L3. A dry pump is provided downstream of the TMP 13, so that the chamber 11 can be decompressed into almost a vacuum state. An APC (Automatic Pressure Controller) 14 is provided between the TMP 13 and the chamber 11. The chamber 11 is controlled to be in a predetermined pressure level by the APC 14.

The system controller 100 controls the entire processes of the processing apparatus 10, including a film formation process and a cleaning process, etc. The system controller 100 includes a timer, for example a software timer.

Figure 2:
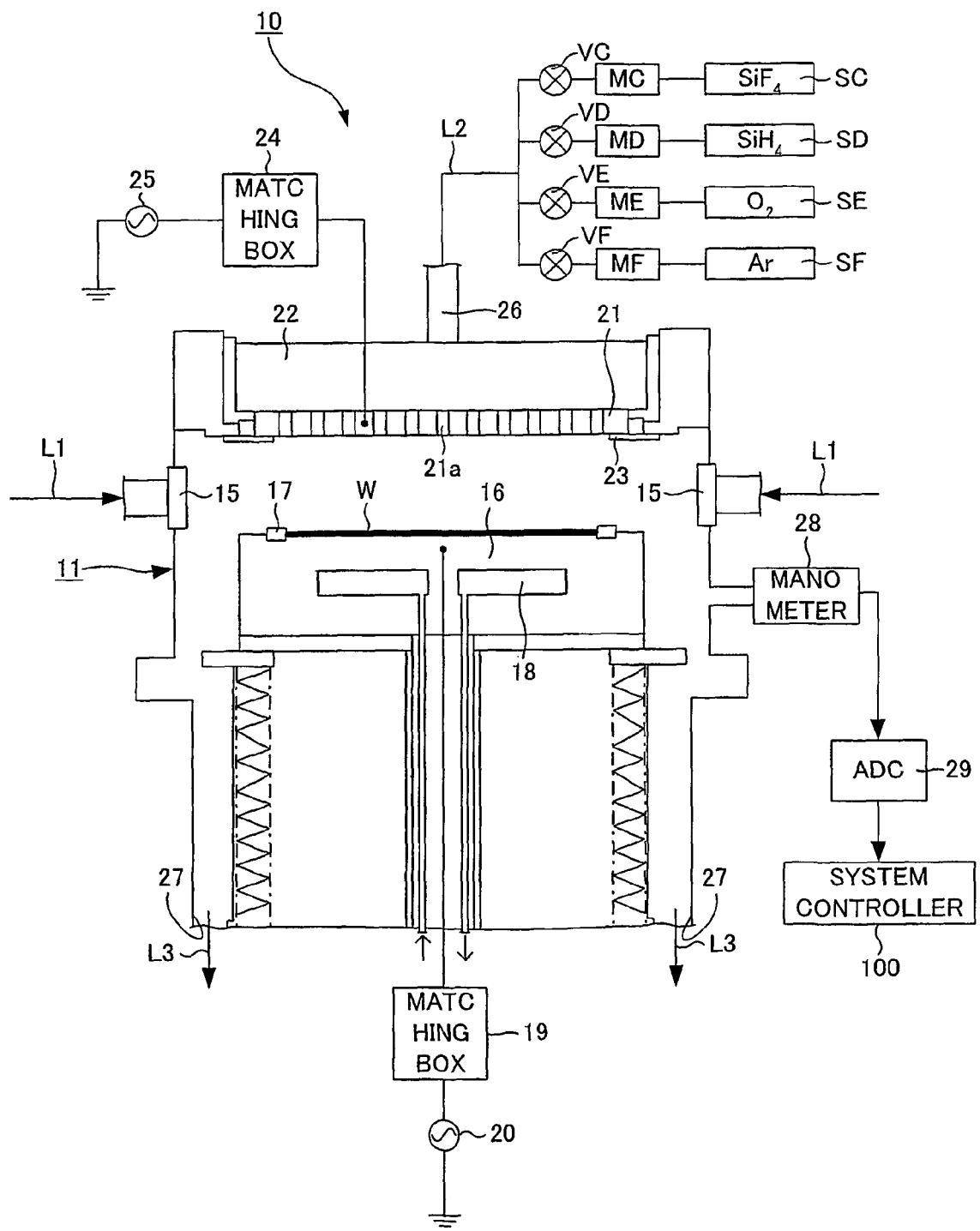
FIG. 2 is a cross sectional view showing a chamber included in the processing apparatus of FIG. 1.

FIG. 2 is a cross sectional view of the chamber 11 of the processing apparatus shown in FIG. 1. For the sake of simplicity, in FIG. 2, the activator 12 connected to the cleaning gas line L1 and the TMP 13 connected to the exhaust line L3 are not illustrated.

As seen from FIG. 2, the chamber 11 is formed approximately in a cylindrical shape, made of aluminum, and is grounded.

Provided on the side wall of the chamber 11 are two cleaning gas inlets 15 facing each other. The two cleaning gas inlets 15 are connected to the cleaning gas line L1. In this structure, the cleaning gas is supplied into the chamber 11 through the cleaning gas inlets 15. The cleaning gas inlets 15 may be closed, during the film formation process.

Provided on the side wall of the chamber 11 is a gate for carrying in and out wafers W to and from the chamber 11 through a gate valve.

A susceptor 16 is provided in the middle of the chamber 11. The susceptor 16 made from a conductor such as aluminum, for example, and formed almost in a cylindrical shape. Mounted on the upper surface of the susceptor 16 is a wafer W and an electrostatic chuck which electrostatically absorbs the wafer W so as to fix the wafer W thereonto.

A focus ring 17 is provided on the upper surface of the susceptor 16. In this structure, plasma can effectively contact the wafer W mounted on the susceptor 16. There is provided in the susceptor 16 a lift pin which can go up and down for receiving and providing the wafer.

A chiller room 18 is provide in the susceptor 16. A chiller flows into each of the chiller room 18 through a pipe. The temperature of the susceptor 16 and wafer W on the susceptor 16 is adjusted by the chiller. Note that, a chiller means a temperature controlling medium herein.

The susceptor 16 is connected to the first RF power source 20 through the first matching box 19. One end of the first RF power source 20 is grounded, so that an RF voltage can be applied to the susceptor 16.

An electrode plate 21 is tightened up to an electrode supporter 22 at the ceiling of the chamber 11. The electrode plate 21 faces and is parallel to the susceptor 16. The electrode plate 21 is formed from a conductor such as aluminum. A Shield ring 23, for protecting the sections of the electrode plate 21 which are fixed to the electrode supporter 22, is provided beneath the peripheral of the electrode plate 21.

The electrode plate 21 is connected to the second RF power source 25 through the second matching box 24. One end of the second RF power source 25 is grounded, so that an RF voltage is applied to the electrode plate 21. Accordingly, the electrode plate 21 and susceptor 16 function respectively as an upper electrode and lower electrode of a parallel-plate-type plasma CVD apparatus.

A process gas inlet pipe 26 is provided on the upper surface of the chamber 11. The process gas inlet pipe 26 is connected to the process gas inlet line L2, so that a process gas is introduced into the chamber 11 through the process gas inlet pipe 26. A diffusing portion with a hollow, etc., for diffusing a process gas is provided on the upper surface of the chamber 11. The electrode plate 21 has a plurality of holes 21a penetrating therethrough. The process gas diffused by the diffusing portion is supplied to the wafer W through the plurality of holes 21a of the electrode plate 21.

An annular vent 27 is provided on the bottom of the chamber 11. The vent 27 is connected to the exhaust line L3. The chamber 11 is exhausted through the vent 27, and retained in a predetermined pressure level.

A manometer 28 is provided on the side surface of the chamber 11. The manometer 28 includes a probe or the like which is provided inside the chamber 11, and measures the pressure inside the chamber 11. The manometer 28 outputs measured pressure data in the form of an analog signal. The output signal from the manometer 28 is converted into a digital signal by an A/D converter (ADC) 29, and sent to the system controller 100.

During the cleaning, the system controller 100 monitors the output data from the manometer 28. The system controller 100 determines whether the cleaning of the chamber 11 substantially completes based on the received data from the manometer 28. In the case where it is determined that the cleaning is substantially completed, the system controller 100 finishes up the cleaning process.

Explanations will now be made to a method for detecting the end point of cleaning based on the pressure inside the chamber 11.

The cleaning of the chamber 11 is carried out using a gas including SiOF and $NF_3$, remaining inside the chamber 11 after the film formation, in the manner described in chemical Formula 2. Note that the cleaning gas supplied into the chamber 11 through the cleaning gas line L1 contains mainly fluorine radical generated by the activator 12.

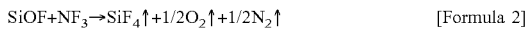
$$SiOF + NF_3 \rightarrow SiF_4\uparrow + 1/2 O_2\uparrow + 1/2 N_2\uparrow \quad \text{[Formula 2]}$$

As shown in Formula 2, gases such as $SiF_4$, $O_2$, and $N_2$ are generated upon decomposition of the SiOF film, thereby increasing the pressure inside the chamber 11. As the cleaning of the chamber 11 advances, SiOF inside the chamber 11 is decreased. Hence, the gases to be generated are decreased, and the pressure inside the chamber 11 lowers. If SiOF deposited inside the chamber 11 is completely removed therefrom, the pressure therein will be constant. Thus, by monitoring the pressure of the chamber 11, the end point of the cleaning can be detected.

In particular, during the cleaning, the system controller 100 activates a timer (e.g. a software timer) upon activation of the activator 12. After this, the system controller 100 obtains a difference in pressure values between predetermined timings. In the case where the obtained difference indicates a negative value for a predetermined number of times within a predetermined period, the system controller 100 determines that the pressure of the chamber 11 has turned to be decreased. The time the monitoring of the pressure begins is not limited to the activation time of the activator 12. The monitoring may begin at an arbitrary timing, such as the time the valve VA is opened, etc.

In the case where the system controller 100 determines that the pressure of the chamber 11 has turned to be decreased, it refers to the timer so as to read the time. The system controller 100 sets the time which is obtained by multiplying the read time by a predetermined coefficient, as the end point of the cleaning. If the time indicated by the timer reaches the set time, the system controller 100 completes the cleaning of the chamber 11.

Cleaning operations of the processing apparatus 10 according to the first embodiment of the present invention will now be described with reference to FIGS. 1 and 2. The following steps will be explained below for exemplary purposes, and the cleaning operations of the processing apparatus 10 are not limited to them.

A wafer W is carried into the chamber 11, and put on the susceptor 16. The wafer W is fixed by the electrostatic chuck. The system controller 100 opens the valve VE so as to start supplying $O_2$ into the chamber 11, and applies an RF power to the upper electrode (the electrode plate 21). The system controller 100 opens the valves VC, VD, VF, so as to supply $SiF_4$, $SiH_4$, Ar into the chamber 11, and applies a power to the lower electrode (the susceptor 16). Thus, plasma of the mixed gas generates, and a SiOF film forming reaction undergoes over the surface of the wafer W.

After the SiOF having a predetermined thickness is formed on the wafer W or after a predetermined period of time elapses, the system controller 100 stops applying an RF power to the lower electrode, closes the valves VC, VD, VF, to stop supplying $SiF_4$, $SiH_4$, and Ar. Then, the electrostatic chuck is released. The system controller 100 closes the valve VE so as to stop supplying $O_2$, and stops applying the RF power to the upper electrode. Now, the wafer W is carried out from the chamber 11, and thus completing the film formation process.

After the above film formation process is performed for a predetermined number of wafers W, the system controller 100 starts the cleaning of the chamber 11.

A dummy wafer W for cleaning is carried into the chamber 11, and put on the susceptor 16. The dummy wafer W put on the susceptor 16 is fixed by the electrostatic chuck. Then, the system controller 100 opens the valves VA and VB so as to supply $NF_3$ and Ar into the chamber 11. After the supplying of $NF_3$ and Ar into the chamber 11, the system controller 100 activates the activator 12. Plasma of the $NF_3$ gas generates in the activator 12, and fluorine radical included in the plasma is selectively supplied into the chamber 11. Using the cleaning gas mainly containing fluorine radical, the SiOF film deposited inside of the chamber 11 is decomposed into $SiF_4$, etc., and exhausted from the chamber 11. Accordingly, the cleaning of the chamber 11 is carried out, so that SiOF inside the chamber 11 is removed therefrom.

If the system controller 100 determines that the cleaning is nearly finished up based on the pressure data received from the manometer 28, the system controller 100 inactivates the activator 12. Further, the system controller 100 closes the valves VA and VB so as to stop supplying the cleaning gas into the chamber 11. After this, the system controller 100 opens the valves VE and VF so as to supply $O_2$ and Ar into the chamber 11. Subsequently, the system controller 100 releases the electrostatic chuck, to stop supplying $O_2$ and Ar. The system controller 100 carries out the dummy wafer W from the chamber 11, thereby completing the cleaning process.

EXAMPLE 1

The pressure in the chamber 11 are monitored during the cleaning, using the processing apparatus 10 of this embodiment. The experiment on the cleaning of the chamber 11 is done as follows:

Inside the chamber 11, a SiOF film having a thickness of 4 µm is formed on the wafer W. After the film formation process, Ar (500 sccm) is supplied into the chamber 11. The pressure inside the chamber 11 set at 200 Pa by the APC 14.

The system controller 100 activates the activator 12, and $NF_3$ (500 sccm) is supplied into the chamber 11. The monitoring of the pressure begins at the time $NF_3$ is supplied into the chamber 11.

Figure 3A:
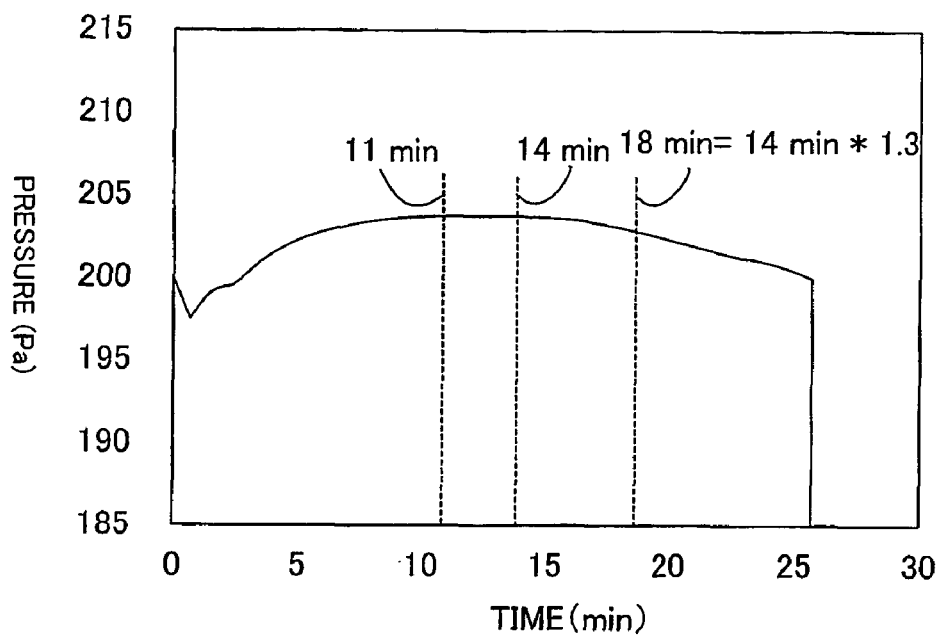
FIG. 3A is a diagram showing the pressure variation in the chamber of FIG. 2 during a cleaning process for cleaning the chamber using the processing apparatus of FIG. 1.

FIG. 3A shows the pressure variation in the chamber 11 during the cleaning process using the processing apparatus 10 of this embodiment. As shown in FIG. 3A, the pressure inside the chamber 11 reaches its highest value at approximately eleven minutes after introduction of $NF_3$ gas into the chamber 11, and begins to decrease at fourteen minutes after the introduction.

The system controller 100 monitors such a variation in the pressures inside the chamber 11, as shown in FIG. 3A. Upon detection of the decrease in the pressure inside the chamber 11, the system controller 100 refers to a value (fourteen minutes) of the timer, and sets a time (eighteen minutes) obtained by multiplying the referred value by a predetermined value (e.g. 1.3), as the end point of the cleaning. If the time indicated by the timer reaches the set end point, the system controller 100 terminates the cleaning process.

Figure 3B:
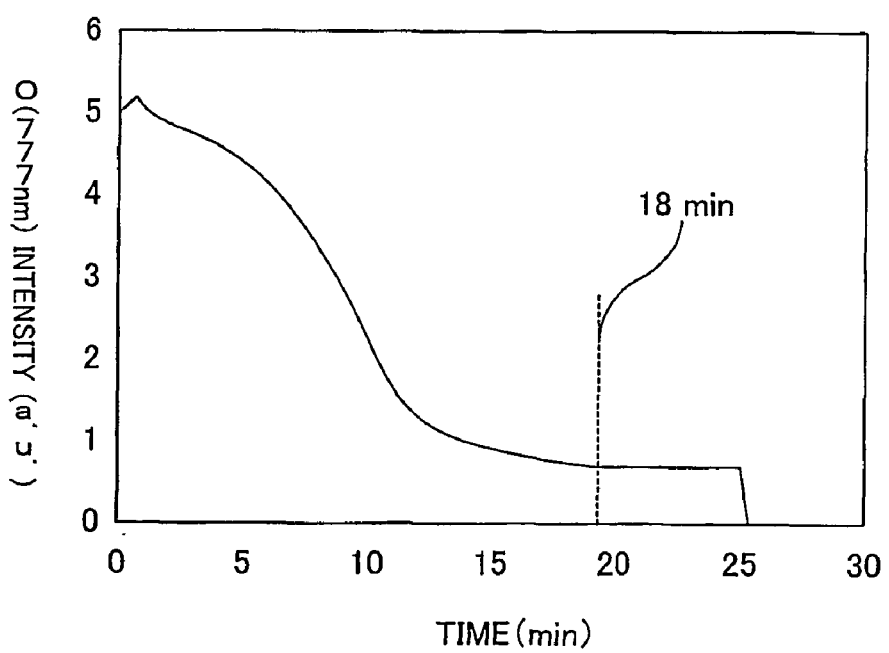
FIG. 3B is a diagram showing an intensity variation of plasma light emission during the cleaning process.

FIG. 3B shows an intensity variation of plasma light emission during the same cleaning process as above, after plasma is generated from the cleaning gas inside the chamber 11. More specifically, FIG. 3 shows intensity levels of plasma light emission of oxygen (O), its wavelength is approximately 777 nm, generated as a result of decomposition of SiOF. As the cleaning advances, SiOF inside the chamber 11 is decreased. As a result, oxygen to be generated is reduced, and the intensity of the light emission is lowered. When the intensity of the light emission of oxygen is constant, it is assumed that the cleaning of the chamber 11 is completed.

As shown in FIG. 3B, the intensity of the plasma light emission is constant, since eighteen minutes after the introduction of $NF_3$ gas into the chamber 11. In this context, the system controller 100 monitors the variation of the pressure in the chamber 11, thus enabling to estimate the completion of the cleaning.

In the first embodiment, the end point of the cleaning is calculated by multiplying the period, since the beginning of the cleaning until the decrease in the pressure level, by a predetermined value (e.g. 1.3 in this embodiment). However, any other method for calculating the end point based on the monitored pressure data can be employed, as long as an accurate end point can be obtained. For example, instead of multiplying the above period, the end point may be obtained by adding a predetermined period of time to the time the pressure level begins to be decreased.

Instead of setting the reference time when the pressure begins to decrease, the end point may be obtained by performing the above multiplication or addition to the reference time when the pressure level indicates the highest level (e.g. eleven minutes as shown in FIG. 3A). Accordingly, a reference time can arbitrarily be set, during the cleaning process, as long as a peculiar pressure variation can be observed at the timing.

Furthermore, in the first embodiment, an initial pressure is fixed by the APC 14, and the pressure inside the chamber 11 is monitored. However, while the pressure inside the chamber 11 is fixed, the exhaust flow rate controlled by the APC 14 is monitored, thereby detecting the end point of cleaning.

Second Embodiment

Figure 4:
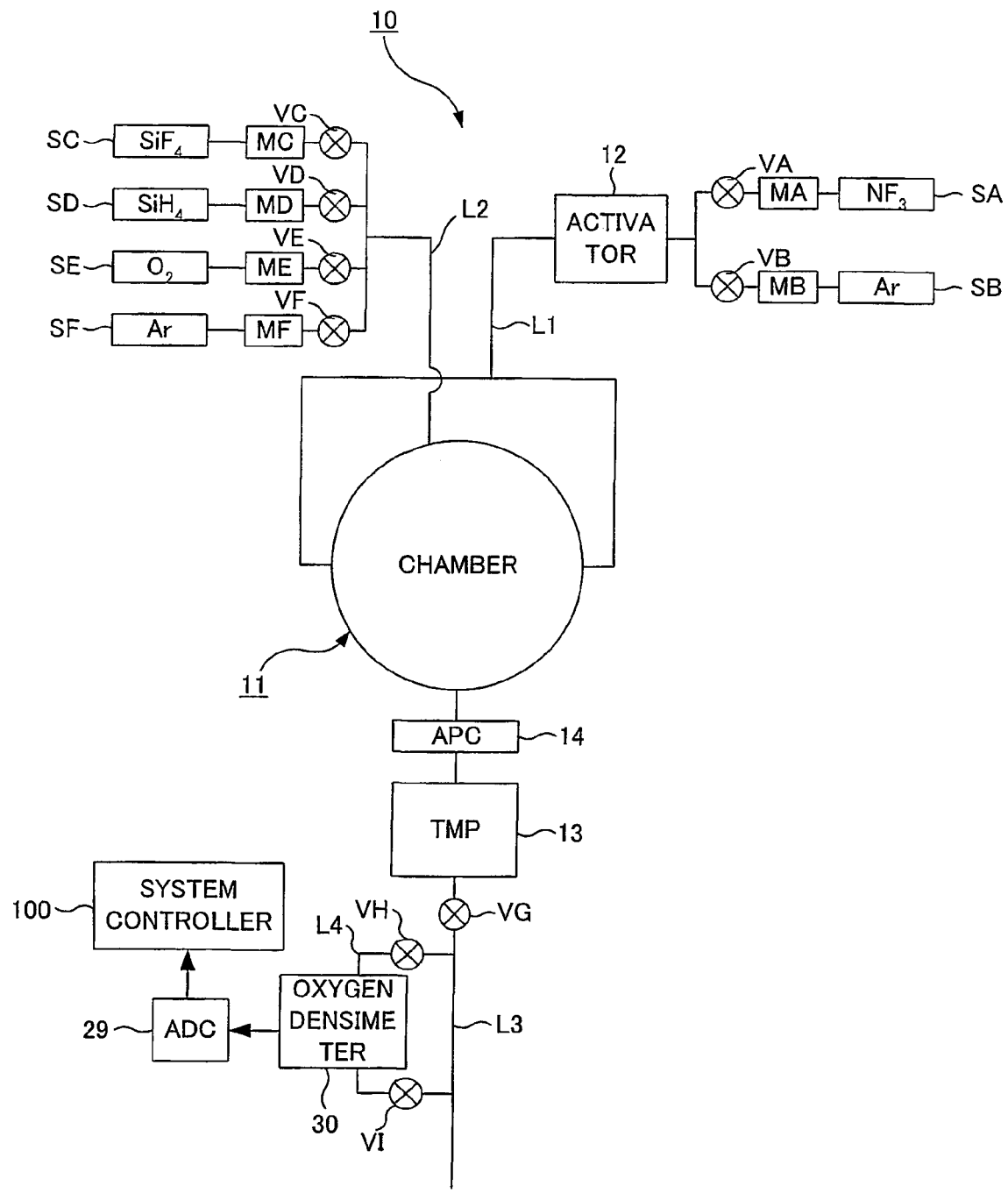
FIG. 4 is a diagram showing the structure of a processing apparatus according to the second embodiment of the present invention.

FIG. 4 shows the structure of a processing apparatus 10 according to the second embodiment of the present invention. In FIG. 4, the same components are identified by the same reference numerals as those of FIGS. 1 and 2. Likewise the first embodiment, the processing apparatus 10 according to the second embodiment first forms a SiOF film on the wafer W inside the chamber 11, and then performs cleaning the inside of the chamber 11 using $NF_3$. As shown in FIG. 4, the processing apparatus 10 of the second embodiment has substantially the same structure as that of the first embodiment. However, the processing apparatus 10 of this embodiment does not include the manometer 28, and does not detect the end point of cleaning based on the pressure data. Instead, the processing apparatus of this embodiment includes an oxygen densimeter for measuring the density of oxygen, and detects the end point based on the density of oxygen during the cleaning.

As illustrated in FIG. 4, the processing apparatus 10 of this embodiment includes a loop portion L4 which is provide in the exhaust line L3. The loop portion L4 is formed behind a valve VG of the exhaust part of the TMP 13. The loop portion L4 is once diverged from the exhaust line L3, and converged on the exhaust line L3 again.

The loop portion L4 comprises two valves VH and VI and the oxygen densimeter 30 which is sandwiched between the valves VH and VI. Note that the diameter of the pipe of the loop portion L4 is smaller than that of the pipe of the exhaust line L3. In this structure, thus, even if the valves VH and VI are opened, the exhaust gas mainly flows to the exhaust line L3.

The oxygen densimeter 30 measures the density of oxygen included in the exhaust gas. The oxygen densimeter 30 is a Zirconia-type oxygen densimeter using a zirconium oxide. The oxygen densimeter 30 outputs the density of oxygen included in the exhaust gas in the form of analog data.

The oxygen densimeter 30 is connected to the system controller 100 through the A/D converter 29. The output data from the oxygen densimeter 30 is converted by the A/D converter 29 into a digital signal, and sent to the system controller 100.

The system controller 100 monitors data representing the density of oxygen, which is output from the oxygen densimeter 30. The system controller 100 determines the end point of cleaning in accordance with a predetermined condition(s). If the system controller 100 determines that the end point has come, the system controller 100 finishes the cleaning of the chamber 11.

Figure 5:
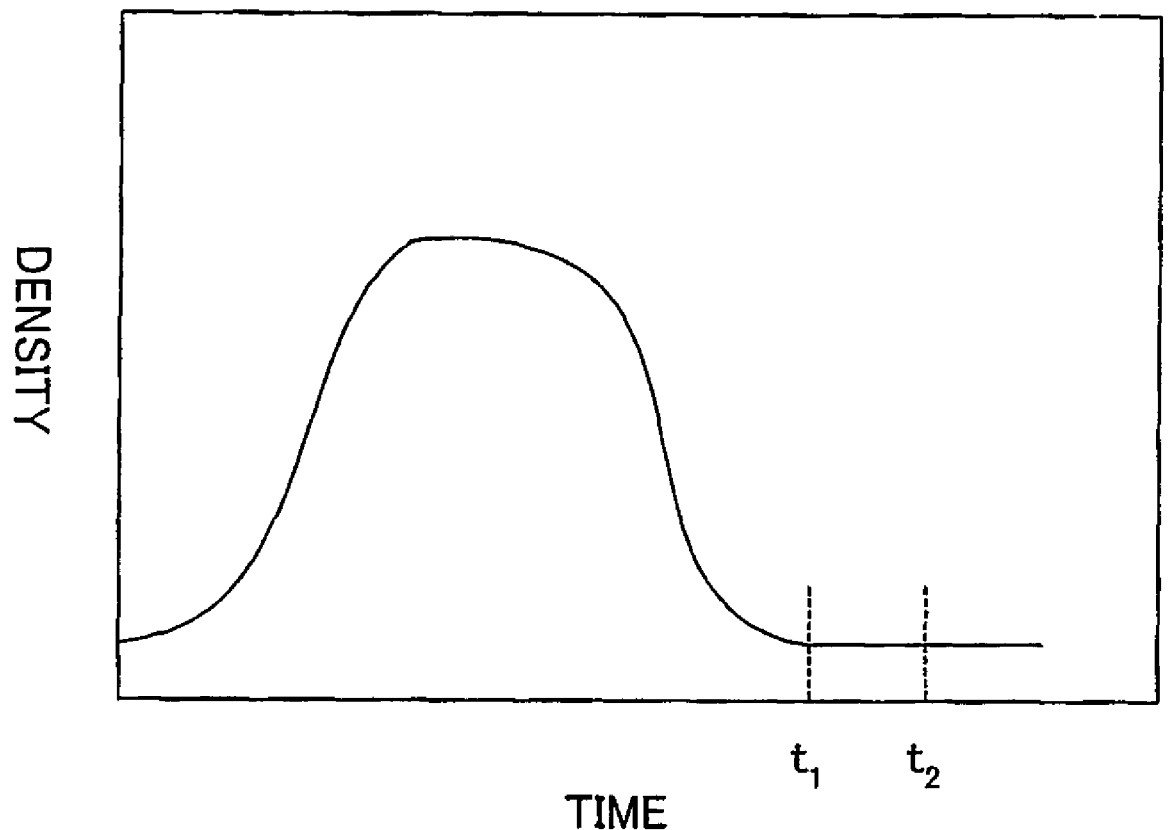
FIG. 5 is a diagram showing a density variation of oxygen in a chamber included in the processing apparatus of FIG. 4, during a cleaning process performed using the processing apparatus.

Explanations will now be made to a method for estimating the completion of cleaning based on the oxygen density data with reference to FIG. 5. FIG. 5 shows a density variation of oxygen included in the exhaust gas, in the case where the chamber 11 is cleaned using the cleaning gas containing $NF_3$ after the film formation process.

As shown in Formula 2, while the cleaning process is carried out, the SiOF film is decomposed and oxygen is generated. The density of oxygen included in the exhaust gas increases at the early stage of the cleaning. However, as the cleaning process advances, SiOF is reduced, and the density of oxygen is decreased so as to be constant in the end. The system controller 100 sets the time the density of oxygen included in the exhaust gas becomes constant, as the end point of cleaning.

In more particular, the system controller 100 activates the timer upon activation of the activator 12, so as to obtain a difference in the density values between predetermined timings. In the case where the obtained difference indicates a value within a predetermined range for a predetermined number of times within a given period of time, the system controller 100 determines that the density of oxygen in the exhaust gas is constant. The monitoring of the density of oxygen may be performed at any time, other than the activation time of the activator 12, such as the timing the valve VA of $NF_3$ is opened, etc. If the system controller 100 determines that the density of oxygen in the exhaust gas is constant, the system controller 100 refers to the timer to read a time $t_1$. Then, the system controller 100 multiplies the read time $t_1$ by a predetermined coefficient value so as to obtain a time $t_2$, and sets the time $t_2$ as the end point of cleaning. The system controller 100 finishes the cleaning of the chamber 11 when the time indicated by the timer reaches the time $t_2$.

Operations of the processing apparatus 10, during the cleaning process, according to the second embodiment of the present invention will now be explained with reference to FIGS. 2 and 4.

Likewise the first embodiment, the system controller 100 begins the cleaning process for cleaning the chamber 11, after the process for forming the SiOF film.

During the cleaning process, the system controller 100 opens the valves VG, VH and VI, so that exhaust from the chamber 11 flows into the loop portion L4. The system controller 100 controls the oxygen densimeter 30 formed in the loop portion L4 to monitor the density of oxygen included in the exhaust gas.

The system controller 100 determines whether the density of oxygen included in the exhaust gas is constant. If the system controller 100 determines that the density of oxygen is constant, the system controller 100 determines the end point of cleaning, as described above. If it is the end point, the system controller 100 inactivates the activator 12, and closes the valve VA so as to stop supplying $NF_3$ into the chamber 11. The system controller 100 closes the valve VB so as to stop supplying Ar into the chamber. Then, the system controller 100 carries out the dummy wafer W from the chamber 11, and thus completing the cleaning process.

Note that the valves VH and VI may be closed at any time after the system controller 100 determines the end point.

In the second embodiment, the end point of cleaning is obtained by multiplying the time when the density of oxygen in the exhaust becomes constant, by a predetermined coefficient. This coefficient is determined based on some experimental results, so that some portion of the chamber 11 which is usually left to be cleaned can sufficiently be cleaned. Instead of multiplying the time by the predetermined coefficient, the end point may be estimated by adding a predetermined period of time to the time the density of oxygen gets constant, for example.

In the above second embodiment, the oxygen densimeter 30 is formed downstream of the TMP 13. The loop portion L4 may include, for example, a fluorine filter for preventing the oxygen densimeter 30 from being deteriorated. The oxygen densimeter 30 may be prepared in any position as long as it can accurately measure the density of oxygen included in the exhaust.

In the above second embodiment, the density of oxygen is monitored so as to detect the end point of cleaning. However, the component to be monitored is not limited to oxygen, and any other components can be employed as long as their density can be monitored during the cleaning process.

Third Embodiment

Figure 6:
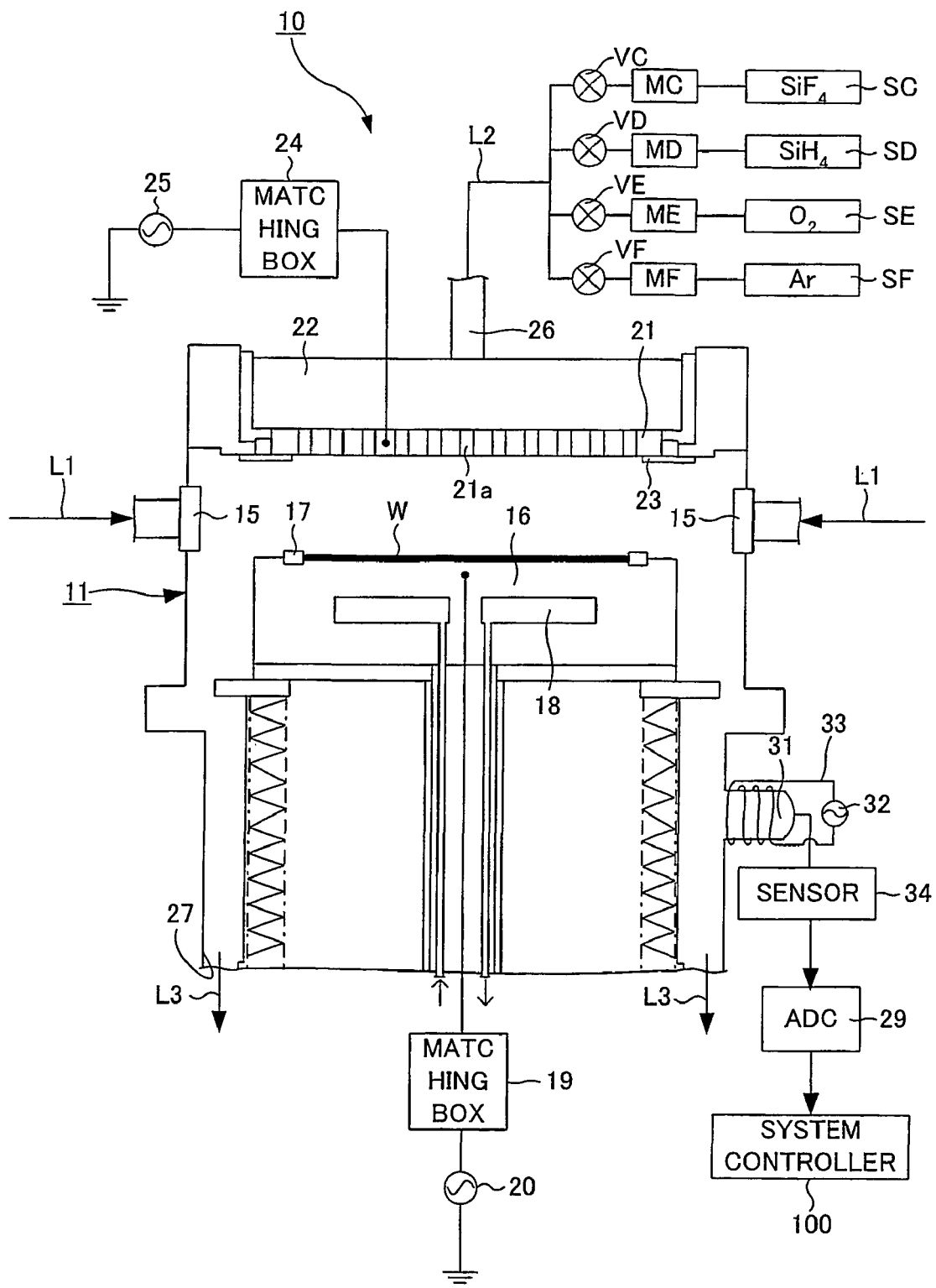
FIG. 6 is a diagram showing the structure of a processing apparatus according to the third embodiment of the present invention.

FIG. 6 shows the structure of a processing apparatus 10 according to the third embodiment of the present invention. In FIG. 6, the same components are identified by the same reference numerals as those of FIG. 2. Likewise the first embodiment, the processing apparatus 10 according to the third embodiment forms a SiOF film on the wafer W inside the chamber 11, and cleans the inside of the chamber 11 using $NF_3$.

As shown in FIG. 6, the processing apparatus 10 of this embodiment has substantially the same structure as that of the processing apparatus of the first embodiment. However, in the processing apparatus 10 of the third embodiment, the chamber 11 does not include the manometer 28, and the system controller 100 does not determine the end point of cleaning based on pressure data obtained by the manometer 28. Instead, in the processing apparatus 10 of this embodiment, plasma are generated inside the chamber 11, and the end point of cleaning is calculated based on data representing plasma emission.

As shown in FIG. 6, a cylindrical section 31 is formed near the vent 27 formed on the lower section of the chamber 11. The cylindrical section 31 is formed from a ceramic material, such as aluminum nitride (AlN) which is resistant to fluorine plasma. The top portion of the cylindrical section 31 is formed from quartz, etc. through which transmitted light can penetrate.

A coil 33 both ends of which are connected to the third RF power source 32 is prepared around the cylindrical section 31. Upon application of an RF power to the coil 33, inductively-coupled plasma are generated inside the cylindrical section 31. $O_2$ generated as a result of decomposition of SiOF exists inside the chamber 11 during the cleaning process, and plasma are generated from $O_2$ upon application of an RF power.

An optical sensor 34 is prepared at the top portion of the cylindrical section 31. The optical sensor 34 is connected to the system controller 100 through the A/D converter 29. The optical sensor 34 detects light (at a wavelength around 777 nm) generated by the oxygen plasma. Data representing the light emission detected by the optical sensor 34 is output in the form of an analog signal, converted into digital data by the A/D converter 29, and finally transmitted to the system controller 100.

The system controller 100 monitors data representing the intensity of light emission which is sent from the optical sensor 34, during the cleaning process. The system controller 100 detects the end point of cleaning based on given conditions, and completes the cleaning process. The intensity variation of plasma light emission obtained by the optical sensor 34, during the cleaning process, is graphed in FIG. 3B.

Specifically, the system controller 100 activates the timer upon activation of the activator 12, and obtains a difference between each pair of intensity levels detected by the optical sensor 34 within a predetermined period. In the case where the difference is within a predetermined range of values, and obtained for a predetermined number of times within a predetermined period of time, the system controller 100 determines that the intensity level of the plasma light emission becomes constant, and sets the time corresponding to this intensity level as the end point of cleaning. Then, the system controller 100 completes the cleaning process at this time. The time the monitoring is started is not limited to the activation time of the activator 12, and the monitoring of the intensity level of the plasma light emission may be started when the valve VA is opened, for example.

In the third embodiment, plasma is generated in some place locally inside the cylindrical section 31 which is formed near the vent 27 underneath the chamber 11. Thus, the end point of cleaning can be detected with less damage of the chamber member.

In the third embodiment of the present invention, the time when the intensity of plasma emission gets constant is set as the end point of cleaning. However, a method for estimating the end point is not limited to this, and thus obtained end point may be multiplied by a predetermined coefficient, or a predetermined period of time may be added to the end point, for example, so as to be set as the end point.

In the third embodiment, the top portion of the cylindrical section 31 is formed from quartz, and measures light penetrating through the top portion thereof. However, any other part of the cylindrical section 31 may be formed from quartz. In addition, the quartz part of the cylindrical section 31 may be coated with a material (e.g. sapphire) which is transparent enough to let light of oxygen plasma penetrate therethrough.

In the third embodiment, the inductive coupled plasma is generated in the cylindrical section 31 underneath the chamber 11. However, such plasma can be generated in any places other than the inside of the cylindrical section 31, as long as the generation does not cause the chamber member to be deteriorated. The method for generating the plasma is not limited to an inductive coupled plasma generation method, and any other methods, such as an ECR (Electron Cyclotron Resonance) method, etc. can be employed.

Fourth Embodiment

Figure 7A:
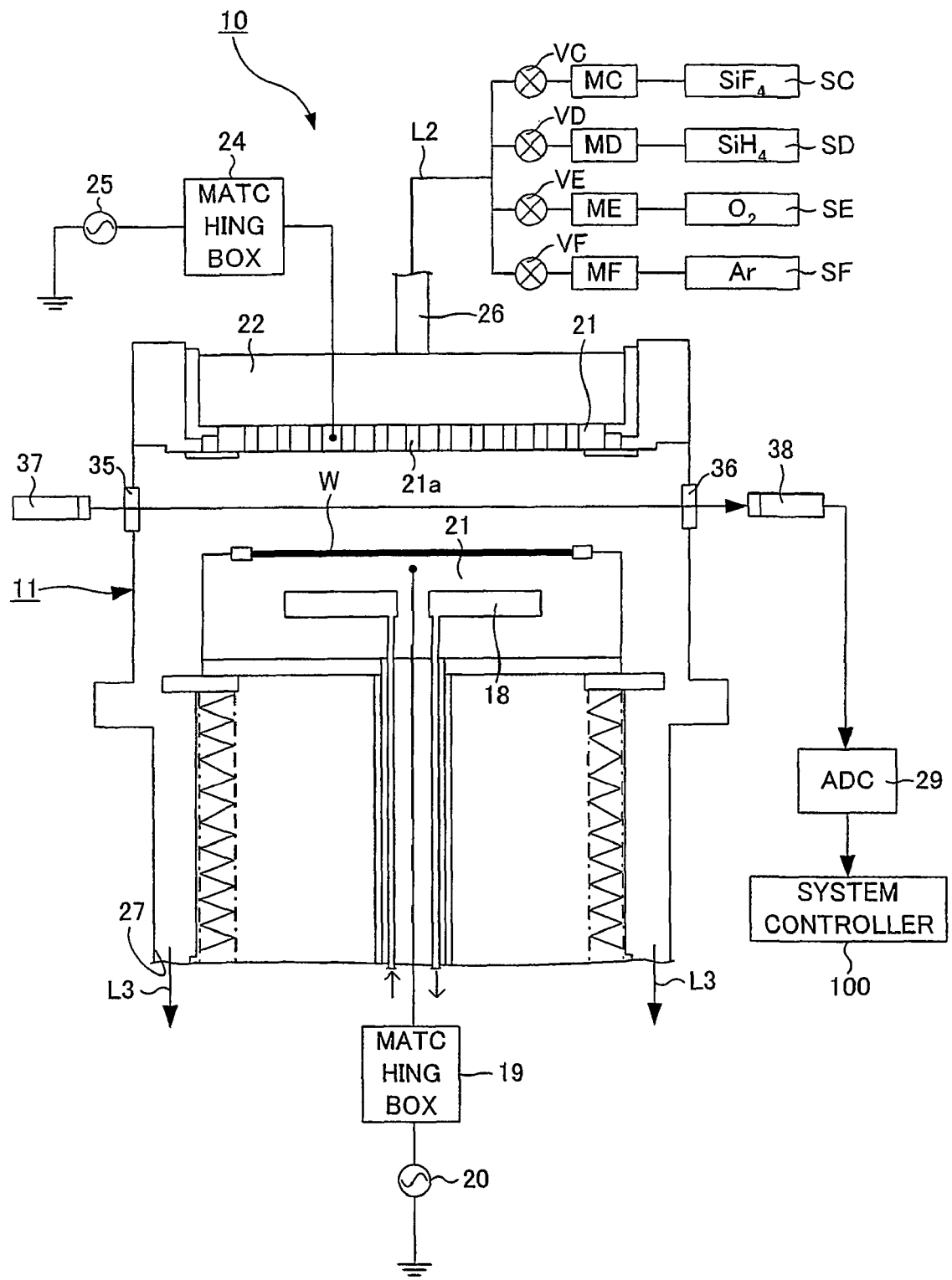
FIGS. 7A and 7B are diagrams showing the structure of a processing apparatus according to the fourth embodiment of the present invention.

FIG. 7A shows the structure of a processing apparatus 10 according to the fourth embodiment of the present invention. In FIG. 7A, the same components are identified by the same reference numerals as those of FIG. 2. Likewise the first embodiment, in the processing apparatus 10 of this embodiment, after the SiOF film is formed on the wafer W inside the chamber 11, the inside of the chamber 11 is cleaned using $NF_3$.

As illustrated in FIG. 7A, the processing apparatus 10 of the fourth embodiment has substantially the same structure as that of the processing apparatus according to the first embodiment. However, the processing apparatus 10 of this embodiment does not include manometer 28, etc., and system controller 100 included in the processing apparatus 10 does not detect the end point of cleaning based on pressure data measured by the manometer 28. Instead, in the processing apparatus 10 according to the fourth embodiment, the system controller 100 detects the end point, based on a thickness level of the SiOF film deposited on the window prepared in the chamber 11.

As shown in FIG. 7A, the first and second windows 35 and 36 facing each other are provided on the side wall of the chamber 11. The internal surface (the surface facing the internal section of the chamber 11) of the first and second windows 35 and 36 are coated with sapphire, an aluminum oxide, or the like. A light source 37, such as a single-wavelength laser, is provided near the outer surface (the surface facing the outer section of the chamber 11) of the first window 35. An optical sensor 38, such as a photo-diode, is provided on the outer surface of the second window 36.

Figure 7B:
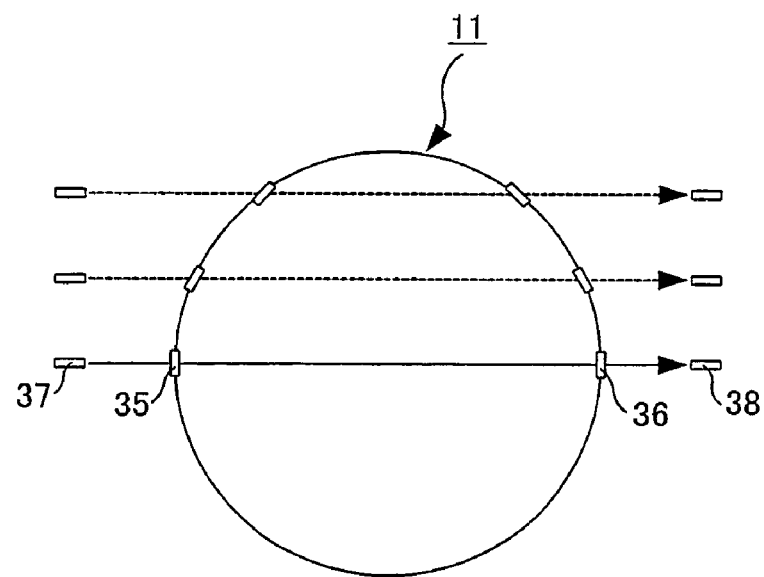

FIG. 7B shows a top view of the chamber 11. As shown in FIG. 7B, the first and second windows 35 and 36 are provided approximately on the diameter line of the circular chamber 11. In this structure, the light irradiated from the light source 37 enters the optical sensor 38 in a straight line through the chamber 11.

The light irradiated from the light source 37 enters chamber 11 through the first window 35. The light entering the chamber 11 is received by the optical sensor 38 through the second window 36. Output from the optical sensor 38 is an analog signal representing the intensity of light passing through the first and second windows 35 and 36.

The optical sensor 38 is connected to the system controller 100 through the A/D converter 29. The signal output from the optical sensor 38 is converted into a digital signal and sent to the system controller 100 through the A/D converter 29.

The system controller 100 monitors data representing the intensity of light, which is sent from the optical sensor 38, during the cleaning process. The system controller 100 finds out the end point of cleaning based on given conditions, and completes the cleaning process.

A method for detecting the end point of cleaning will now be explained.

The system controller 100 irradiates light to the optical sensor 38 through the first and second windows 35 and 36. SiOF is deposited on the internal surface of each of the first and second windows 35 and 36, after the film formation process. As the cleaning process advances, the thickness of SiOF film deposited on the surface of each of the first and second windows 35 and 36 is reduced. Hence, the optical characteristics of the light transmitted through the first and second windows 35 and 36 are changed because of the thickness of the deposited SiOF film. That is, the phase of the light to be measured changes by the effect of the deposited SiOF film, hence an interference state of the light occurs in accordance with the thickness of the SiOF film.

Figure 8:
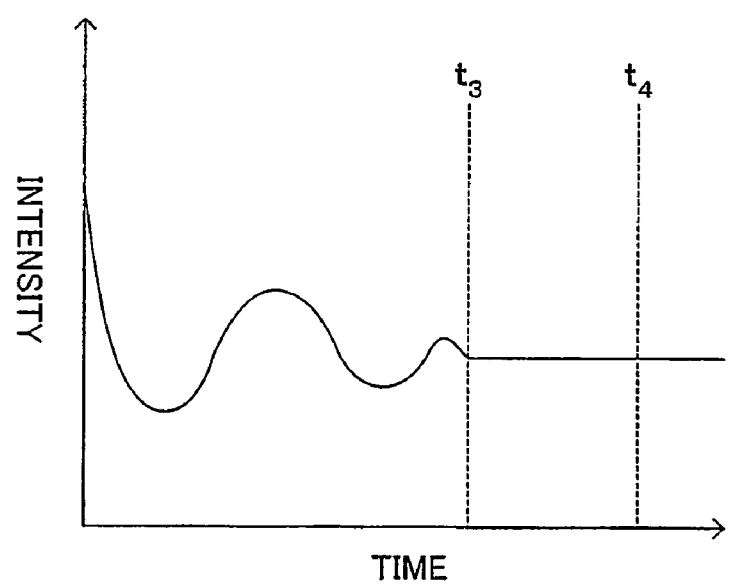
FIG. 8 is a diagram showing the intensity variation of measured light inside a chamber included in the processing apparatus of FIG. 7A, during a cleaning process performed using the processing apparatus of FIG. 4.

FIG. 8 schematically shows the intensity variation of measured light, during the cleaning process. As shown in FIG. 8, at an early and intermediate stages in its cleaning, the SiOF film remains in thick on the surface of each of the first and second windows 35 and 36, resulting in great interference of light. Since the thickness of the SiOF film is reduced as the cleaning of the chamber 11 advances, the intensity level and direction of the light change. At a final stage in its cleaning, the thickness of the SiOF film is very small, and if the interference of the measured light does not occur any more, the intensity of light becomes constant (at a time $t_3$ in FIG. 8).

The system controller 100 determines a time $t_4$, which is obtained by multiplying the time $t_3$ by a predetermined coefficient, as the end point of cleaning. While the surface of each of the first and second windows 35 and 36 can relatively be cleaned with ease, other parts of the inside of the chamber 11 which can not easily be cleaned can sufficiently be cleaned by the time $t_4$.

In the fourth embodiment, the first and second windows 35 and 36 are provided on the diameter line of the chamber 11. However, the position of the windows 35 and 36 is not limited to the above. For example, as shown in FIG. 7B, the first and second windows 35 and 36 may be provided in such a manner that the light passes through the chamber 11.

Otherwise, there may be prepared only one window, instead of the two windows, and a reflection plate, etc. may be provided inside the chamber 11. In this case, the light entering from this window is reflected by the reflection plate, and gets out from the chamber 11 from the same window. An angle of the reflection may be adjusted, and the light source 37 and optical sensor 38 may be provided near the only window, so that data representing the light can be monitored.

In the fourth embodiment, the light source 37 emits a single-wavelength laser. However, the light is not limited to a single-wavelength laser, and light having a plurality of wavelengths or predetermined range of wavelengths may be emitted from the light source 37.

In the fourth embodiment, the end point of cleaning ($t_4$) is obtained, by the multiplication of the time $t_3$, in which the interference of light becomes constant, by a predetermined coefficient. However, the end point $t_4$ may be obtained by adding a predetermined period of time to the time $t_3$.

Fifth Embodiment

Figure 9:
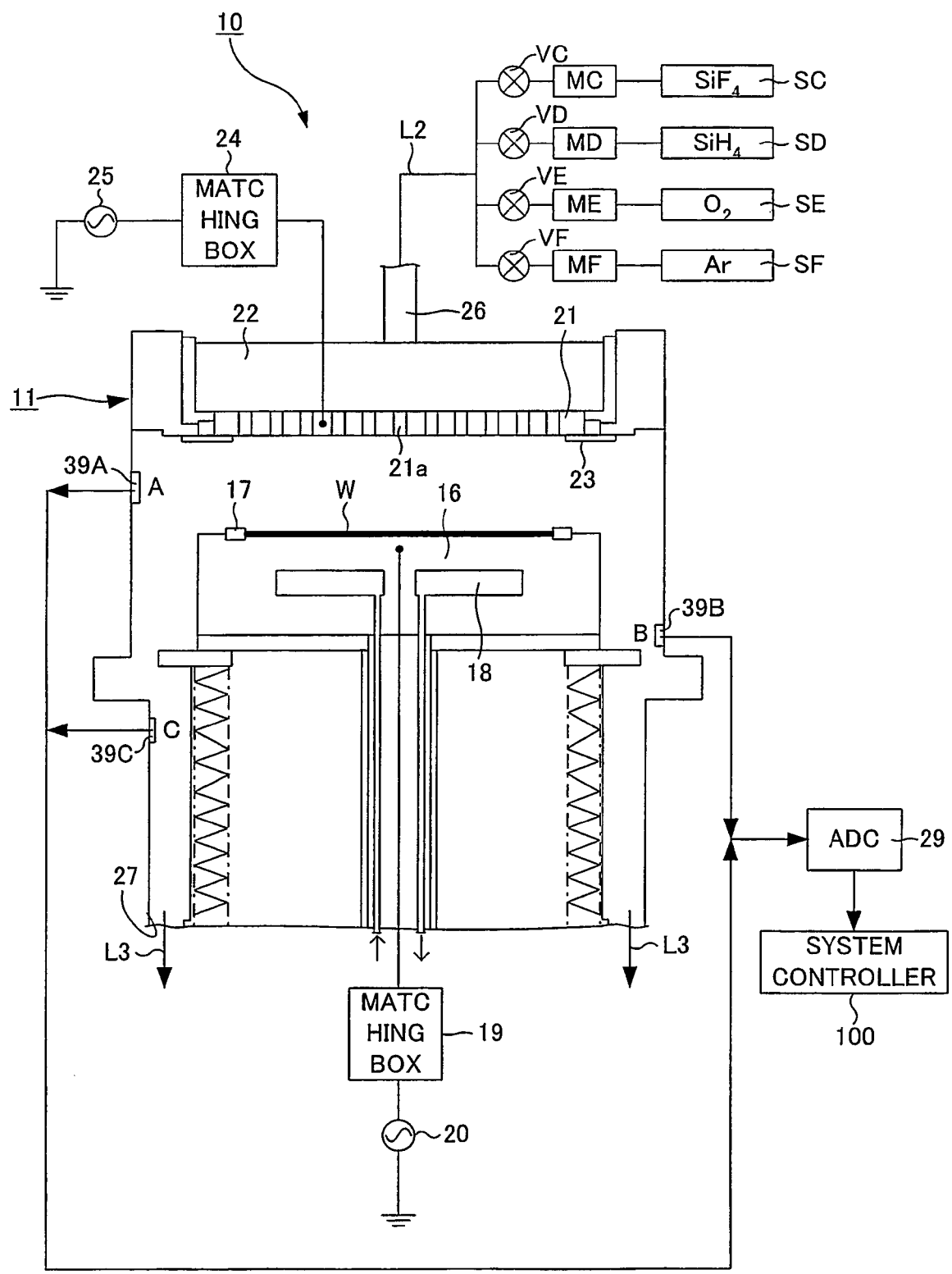
FIG. 9 is a diagram showing the structure of a processing apparatus according to the fifth embodiment of the present invention.

FIG. 9 shows the structure of a processing apparatus 10 according to the fifth embodiment of the present invention. In FIG. 9, the same components are identified by the same reference numerals as those of FIG. 2. For the sake of simplicity, in FIG. 9, the cleaning gas line L1 and cleaning gas inlets 15 are not illustrated. In the processing apparatus 10 of this embodiment, likewise the first embodiment, after a SiOF film is formed on the wafer W inside the chamber 11, the inside of the chamber 11 is cleaned using $NF_3$.

As shown in FIG. 9, the processing apparatus 10 of the fifth embodiment has substantially the same structure as that of the first embodiment. However, the processing apparatus 10 of this embodiment does not include the manometer 28, and does not detect the end point of cleaning based on pressure data. Instead, the processing apparatus 10 of this embodiment detects the end point of cleaning using thickness sensors 39 provided in the chamber 11.

As shown in FIG. 9, three thickness sensors 39A, 39B, and 39C for detecting the thickness of the SiOF film are provided respectively on the points A, B, and C, on the internal surface of the chamber 11. The point A is located in a position of the internal surface between the susceptor 16 and electrode plate 21, the point B is located in a position of the internal surface underneath the susceptor 16, and the point C is located in a position of the internal surface which is lower than the point B.

Each of the thickness sensors 39A to 39C includes a quartz oscillator, and measures the thickness of a target film, on the assumption that the frequency varies in accordance with the thickness of film adhered onto the quartz. Each of the thickness sensors 39A to 39C outputs data representing the thickness of film deposited thereon, in the form of an analog signal.

The thickness sensors 39A to C are connected to the system controller 100 through the A/D converter 39. Data representing the thickness of the deposited film, as sent from each of the thickness sensors 39A to 39C, is converted into a digital signal and sent to the system controller 100 by the A/D converter 29.

The system controller 100 monitors the analog signal of the data representing the thickness and being sent from the thickness sensors 39, during the cleaning process. The system controller 100 detects the end point of cleaning based on a predetermined condition, and finishes the cleaning process.

In more particular, the system controller 100 activates the timer upon activation of the activator 12, and reads the timer upon reception of output data representing that the thickness of the deposited film is 0 (zero) from the three thickness sensors 39A to 39C. The system controller 100 multiplies this read time by a predetermined coefficient, and sets the resultant as the end point of cleaning. Later, if the time read from the timer is the set end point, the system controller 100 completes the cleaning process. The monitoring of the analog signal may be started at any time, other than the activation time of the activator 12, such as the time the valve VA is opened, etc.

EXAMPLE 2

Figure 10:
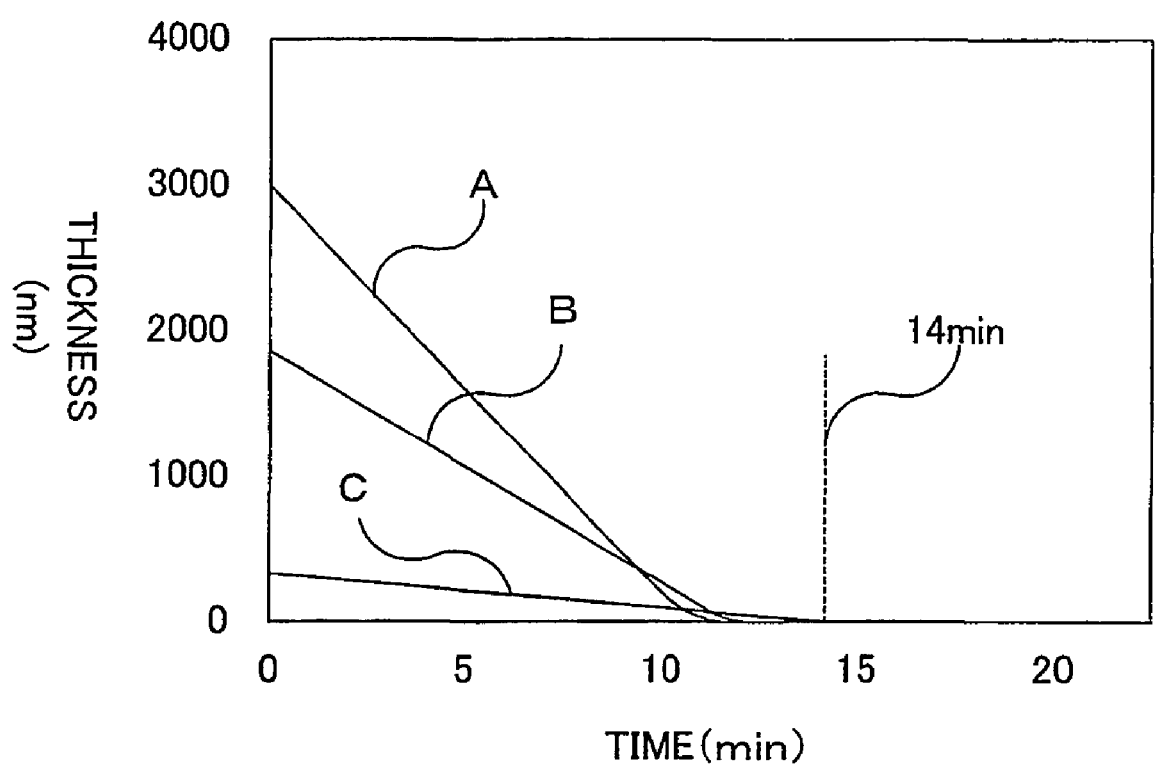
FIG. 10 is a diagram showing data representing thickness of films formed inside the chamber of processing apparatus of FIG. 4, during a cleaning process performed using the processing apparatus.

FIG. 10 shows monitored thickness of film during the cleaning process performed using the processing apparatus according to the fourth embodiment. The experiment on cleaning of the chamber 11 is done as follows:

A SiOF film having a thickness of 4 μm is formed on the wafer W inside the chamber 11. After the film formation process, Ar of 500 sccm is supplied into the chamber 11, and the pressure in the chamber 11 is set at 200 Pa by the APC 14.

Then, the system controller 100 activates the activator 12, and supplies $NF_3$ (500 sccm) into the chamber 11. The monitoring begins upon application of $NF_3$ into the chamber 11.

As illustrated in FIG. 10, as the cleaning process advances, the thickness of the film at each points A, B, and C is reduced. The thickness of the film deposited on the thickness sensors 39A to 39C became 0 successively in the order of the points A, B and C. Note that the thickness of the film deposited on the thickness sensor 39C, which was the latest point that the thickness of film became 0, became 0 at about fourteen minutes. From this, the time (eighteen minutes) which is obtained by multiplying the time (fourteen minutes in this case) by a predetermined coefficient (e.g. 1.3) is set as the end point of cleaning.

In the above fifth embodiment, the three thickness sensors 39 each including the quartz oscillator are prepared inside the chamber 11. However, each of the thickness sensors 39 does not have to necessarily include the quartz oscillator, and any other sensors, which can measure the thickness of the deposited film in-situ, may be employed. The number of the thickness sensors 39 is not limited to three, and four or more than four thickness sensors may be prepared in any positions, including the ceiling section of the chamber 11, etc.

Sixth Embodiment

Figure 11:
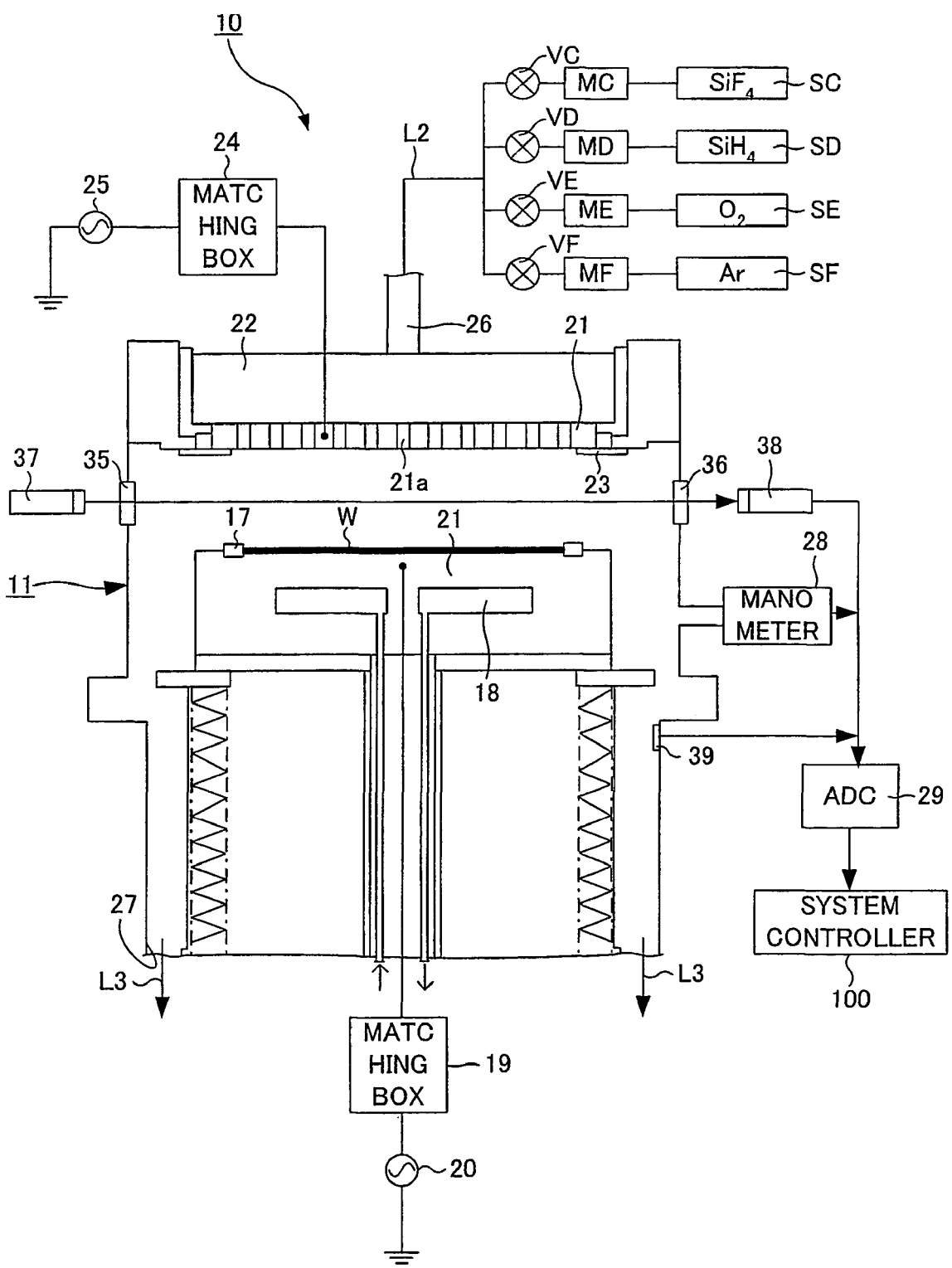
FIG. 11 is a diagram showing the structure of a processing apparatus according to the sixth embodiment of the present invention.

FIG. 11 shows the structure of a processing apparatus 10 according to the sixth embodiment of the present invention. In FIG. 11, the same components are identified by the same reference numerals as those of FIGS. 1 and 2. For the sake of simplicity, in FIG. 9, the cleaning gas line L1 and cleaning gas inlets 15 are not illustrated. In the processing apparatus 10 of this embodiment, the SiOF film is formed on the wafer W inside the chamber 11, and the inside of the chamber 11 is cleaned using $NF_3$, likewise the first embodiment. The processing apparatus 10 of the sixth embodiment has the structure in combination with the structures of the processing apparatus 10 respectively according to the first, fourth, and fifth embodiments. As seen from FIG. 11, the processing apparatus 10 of the sixth embodiment includes the manometer 28, optical sensor 38, and thickness sensor 39, described in the above first to fifth embodiments. The manometer 28, optical sensor 38, and thickness sensor 39 are connected to the system controller 10 through the A/D converter 29.

The system controller 100 monitors the pressure data, data representing the interference of light, and data representing the thickness of deposited film, which are respectively output from the manometer 28, optical sensor 38 and thickness sensor 39. Among of the time the pressure begins to be decreased, the time the intensity of light begins to be constant, and the time the deposited films reach an identical thickness, the system controller 100 multiplies the latest time by a predetermined coefficient (e.g. 1.3), and sets the resultant as the end point of cleaning. At this time, the system controller 100 refers to two or more than two types of data, of the pressure data, light-interference data, and thickness data.

EXAMPLE 3

Figure 12:
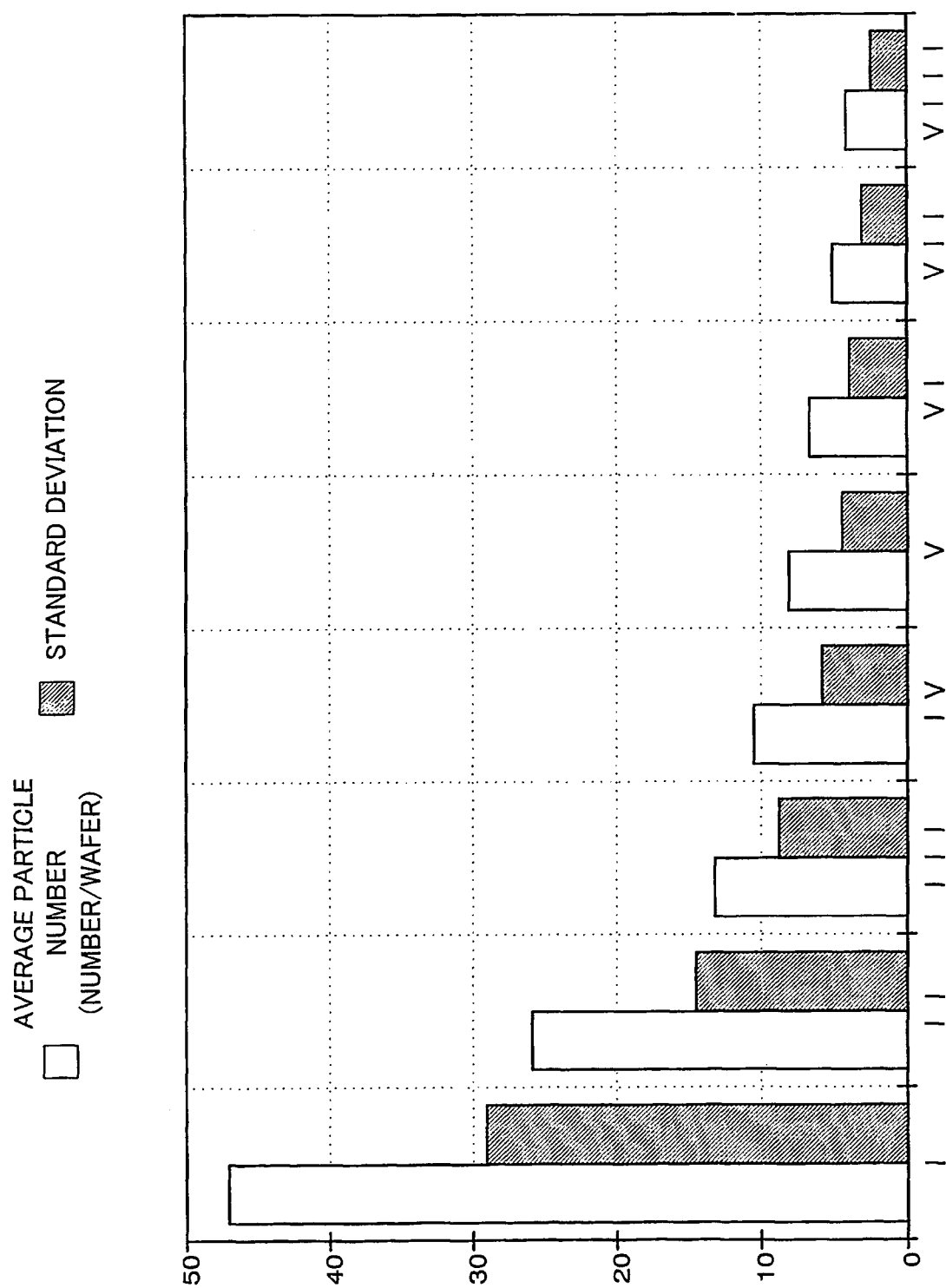
FIG. 12 is a diagram showing cleaning results performed using the processing apparatus of FIG. 11 in combination with the structures of the processing apparatus of other embodiments.

FIG. 12 shows a plurality of cleaning results achieved by the processing apparatus 10 according to the sixth embodiment, and measured after a predetermined time upon completion of cleaning. The experiment on the cleaning of the chamber 11 is done as follows:

A SiOF film having a thickness of 4 μm is formed on the wafer W inside the chamber 11. After the film formation process, Ar (500 sccm) is supplied into the chamber 11, and the chamber 11 is retained at a pressure of 200 Pa by the APC 14.

The system controller 12 activates the activator 12, and provides the chamber 11 with $NF_3$ (500 sccm). The monitoring of the pressure begins upon supplying of $NF_3$.

In FIG. 12, the y-axis indicates the average number of particles. The average number of particles is a mean value (number/wafer W) of numbers of particles generated when 2,000 wafers are successively processed on the above conditions. The measurement of particles is carried out for one wafer W per cassette containing 25 wafers. In FIG. 12, the average numbers of particles are shown together with their standard deviation values. Higher average number of particles means lower cleanness of the chamber 11. And higher standard deviation value means wider variation of the end point of cleaning, i.e., less accurate detection of the end point.

In FIG. 12, a symbol "I" indicates a result of cleaning performed for a predetermined period of, for example, 20 minutes. A symbol "II" indicates a result of cleaning completed at a end point obtained based on the pressure data. A symbol "III" indicates a result of cleaning completed at a end point obtained based on data representing the interference of light. A symbol "IV" indicates a result of cleaning completed at a end point obtained based on data representing the thickness of film. A symbol "V" indicates a result of cleaning completed at a end point obtained based on both the pressure data and the data representing the interference of light. A symbol "VI" indicates a result of cleaning completed at a end point obtained based on both the pressure data and the data representing the thickness of films. A symbol "VII" indicates a result of cleaning completed at a end point obtained based on both the data representing the thickness of films and the interference data. A symbol "VIII" indicates a result of cleaning completed at a end point obtained based on all of the pressure data, data representing the interference of light, and data representing the thickness of films.

As illustrated in FIG. 12, in the cases where at least one of the pressure data, data representing the interference of light and data representing the thickness of films (II to VIII) are employed, cleaning is possible with higher cleanness and higher accurate detection of the endpoint, than in the case where the fixed end point (20 minutes) is employed (I). a wide variety of degrees of cleanness are achieved. From this result, the end Then, in the cases where two of the pressure data, data representing the interference of light, and data representing the thickness of films are employed (V–VII), cleaning is possible with higher cleanness and higher accuracy in detection of the endpoint, than in the case where at least one data among three data above (II–IV). Further, in the case where all of the three data are employed (VIII), cleaning is possible with highest cleanness and highest accuracy in detection of the end point.

In the above sixth embodiment, those data used for obtaining the end point of cleaning include the pressure data, data representing the interference of light, and data representing the thickness of films. However, those data for obtaining the end point of cleaning are not limited to the above three kinds of data, and any other kinds of data can be used as well, as long as the end point of cleaning can desirably be obtained. For example, data representing the density of oxygen, as described in the second embodiment, and/or data representing the intensity level of plasma emission, as described in the third embodiment, may be used.

In the above-described first to fifth embodiments, no RF power is not applied to the susceptor 18 and electrode plate 21 inside the chamber 11, during the cleaning process. However, an RF power may be applied to the susceptor 18 and electrode plate 21 during the cleaning process, so as to generate plasma inside the chamber 11. Hence, the cleaning gas activated by the activator 12 is further activated, and thus achieving to obtain a higher level of cleaning.

In the above embodiments, the cleaning gas is activated so as to generate plasma, especially radical included in the plasma. However, active species, other than radical, may be generated upon activation of the cleaning gas so as to perform the cleaning process.

In the first to sixth embodiments, using the parallel-plate-type plasma processing apparatus 10, the SiOF film is formed on the wafer W, and cleaning is carried out using $NF_3$ gas. However, the film to be formed is not limited to the SiOF film, and any other silicon-containing films, such as $SiO_2$, SiC, SiN, SiCN, SiCH, SiOCH, etc., may be formed. In addition, the cleaning gas to be used for cleaning the chamber 11 is not limited to $NF_3$, and any other fluorine-containing gas, such as $CF_4$, $C_2F_6$, $SF_6$, etc., or chlorine-containing gas, such as $Cl_2$, $BCl_4$, etc., may be employed. This invention may be employed to a processing apparatus for, not only the semiconductor wafers W, but also liquid crystal display devices, etc.

Furthermore, the present invention is applicable not only to the parallel-plate-type plasma processing apparatus, but also to any other types of processing apparatus, such as an ECR-type, ICP-type, helicon-type processing apparatus. In addition, the present invention is applicable not only to the CVD apparatus, but also to any other types of apparatus, such as an etching apparatus, sputtering apparatus, thermal processing apparatus, etc.

INDUSTRIAL APPLICABILITY

The present invention mentioned above is useful for manufacturing semiconductor products.

This application is based on Japanese Patent Application No. 2000-240292 filed on Aug. 8, 2000 and including specification, claims, drawings and summary. The disclosure of the above Japanese Patent Application is incorporated herein by reference in its entirety.

The invention claimed is:

1. A processing apparatus comprising:
   a chamber;
   a gas source for supplying a gas for cleaning inside of said chamber;
   a gas line for introducing the gas supplied from said gas source into said chamber;

an activator which is prepared in said gas line and activates the gas supplied from said gas source;

a locally-plasma-generation mechanism, arranged at a protruding section which is formed on said chamber, for locally generating plasma near the protruding section in said chamber;

an optical sensor for detecting light emission of a predetermined component in plasma generated by said locally-plasma-generation mechanism; and a controller which detects an end point of a cleaning, based on data representing characteristics of the light detected by said optical sensor.

2. The processing apparatus according to claim 1, further comprising a plasma generation mechanism, to provide a target object with plasma processing in said chamber.

3. The processing apparatus according to claim 1, wherein said activator generates plasma of the gas.

4. The processing apparatus according to claim 1, wherein the gas contains fluorine.

5. A processing apparatus comprising:

a chamber including a first and second windows;

a gas source for supplying a gas for cleaning inside of said chamber;

a gas line for introducing the gas supplied from said gas source into said chamber;

an activator which is prepared in said gas line and activates the gas supplied from said gas source;

a light source for irradiating laser light into said chamber through the first window;

an optical sensor which receives the laser light irradiated from said light source and passed successively through said chamber and the first and second windows, and which measures the intensity of the laser light received through a film deposited on the first and second windows to detect an interference state of the laser light changed in accordance with a thickness of the deposited film; and a controller which determines an end point of cleaning of the inside of said chamber, by detecting a time when the intensity of the laser light passing through the deposited film becomes constant, based on data representing the interference state of the laser light measured by said optical sensor.

6. The processing apparatus according to claim 5, wherein the first and second windows oppose each other.

7. The processing apparatus according to claim 5, wherein the first and second windows are coated with a material which is resistant to plasma.

8. The processing apparatus according to claim 5, wherein said optical sensor includes a photodiode.

9. The processing apparatus according to claim 5, wherein the light is a single-wavelength laser beam.

10. The processing apparatus according to claim 5, further comprising a plasma generation mechanism, to provide a target object with plasma processing in said chamber.

11. The processing apparatus according to claim 5, wherein said activator generates plasma of the gas.

12. The processing apparatus according to claim 5, wherein the gas contains fluorine.

13. A method for cleaning inside of a chamber, for performing predetermined processing for a target object thereinside, by supplying a gas activated outside said chamber into said chamber, said method comprising the steps of:

generating plasma locally near a protruding section, which is formed on said chamber, in said chamber, by a local-plasma-generator arranged at the protruding section;

detecting light emission of a predetermined component in plasma generated locally in said plasma; and detecting an end point of cleaning of said chamber, based on data regarding characteristics of the light detected by said step of detecting.

14. The method according to claim 13, wherein the predetermined processing is plasma processing.

15. The method according to claim 13, wherein the gas is activated so as to be plasma.

16. A method for cleaning inside of a chamber with a window for performing predetermined processing for a target object thereinside, by supplying a gas activated outside said chamber into said chamber, and said method comprising the steps of:

emitting laser light passing through said chamber via the window;

measuring the intensity of the laser light having passed said chamber and the window on which a film is already deposited to measure the interference state of the laser light changed in accordance with a thickness of the deposited film; and detecting an end point of cleaning of said chamber, by detecting a time when the intensity of the laser light passing through the deposited film becomes constant, based on data regarding the interference state of the laser light which is measured by said step of measuring.

17. The method according to claim 16, wherein the predetermined processing is plasma processing.

18. The method according to claim 16, wherein the gas is activated so as to be plasma.

* * * * *